US00RE37500B1

(19) United States
(12) Reissued Patent
Lee

(10) Patent Number: US RE37,500 E
(45) Date of Reissued Patent: Jan. 8, 2002

(54) SYSTEM FOR PARTITIONING AND TESTING SUBMODULE CIRCUITS OF AN INTEGRATED CIRCUIT

(75) Inventor: Nai-Chi Lee, Peekskill, NY (US)

(73) Assignee: North American Philips Corporation, New York, NY (US)

(21) Appl. No.: 08/752,827

(22) Filed: Nov. 20, 1996

Related U.S. Patent Documents

Reissue of:
(64) Patent No.: 5,107,208
Issued: Apr. 21, 1992
Appl. No.: 07/715,035
Filed: Jun. 11, 1991

U.S. Applications:

(63) Continuation of application No. 08/229,482, filed on Apr. 19, 1994, now abandoned, which is a continuation of application No. 07/452,870, filed on Dec. 19, 1989, now abandoned.

(51) Int. Cl.[7] ..... G01R 31/28
(52) U.S. Cl. ..... 324/765; 324/73.1; 714/733
(58) Field of Search ..... 324/158.1, 73.1, 324/763, 765; 371/22.1, 22.31, 22.32, 22.5, 22.6, 25.1; 257/48; 365/201; 714/724, 733, 734, 736

(56) References Cited

U.S. PATENT DOCUMENTS 1,120,606 A * 12/1914 Dean ..... 379/179
1,492,219 A * 4/1924 Quass ..... 379/179
1,533,153 A * 4/1925 Williams, Jr. ..... 379/179
4,286,173 A * 8/1981 Oka et al. ..... 326/16
4,357,703 A * 11/1982 Van Brunt ..... 714/733
4,743,841 A * 5/1988 Takeuchi ..... 324/763
4,893,311 A * 1/1990 Hunter et al. ..... 714/733
4,918,379 A * 4/1990 Jongepier ..... 324/73.1

OTHER PUBLICATIONS

McClusky, E.J., "Design . . . "; IEEE Trans. on Computers; v. C–30; No. 11; Nov. 1981; pp. 866–874.*

Wagner et al; "Design for Testability . . . "; IEEE 1988 Internat. Test Conference, Paper 39.1; 1988; pp. 823–828.*

Fasang et al; "Design for Testability . . . "; Proceedings of the IEEE 1988 Custom Integrated Circuits Conference; pp. 16.5.1–16.5.4.*

* cited by examiner

*Primary Examiner*—Ernest F. Karlsen
(74) *Attorney, Agent, or Firm*—Michael E. Marion

(57) ABSTRACT

A system for providing testing capability of individual submodules on an integrated circuit module. A test bus having a plurality of conductors is connected to selected internal ports of said submodules through three-way analog switches. Each three-way analog switch provides the capability to observe and control an internal port through combination of the ON/OFF status of two transmission gates. Test patterns for controlling the transmission gates may be provided by onboard D flip-flops which are externally programmed to control or observe ports of an individual submodule.

34 Claims, 3 Drawing Sheets

SYSTEM FOR PARTITIONING AND TESTING SUBMODULE CIRCUITS OF AN INTEGRATED CIRCUIT

Matter enclosed in heavy brackets [ ] appears in the original patent but forms no part of this reissue specification; matter printed in italics indicates the additions made by reissue.

This *application is a continuation of reissue application Ser. No. 08/229,482, filed Apr. 19, 1994, now abandoned, which is an application for the reissue of application Ser. No. 07/715,035, filed Jun. 11, 1991, now U.S. Pat. No. 5,107,208, granted Apr. 21, 1992, which* is a continuation of application Ser. No. 07/452,870, filed Dec. 19, 1989, now abandoned.

The present invention relates to testing of integrated circuits by partitioning the integrated circuit into submodules by the use of three-way analog switches, and individually testing the partitioned submodules. Specifically, a technique which reduces the number of required transmission gates, while increasing the level of testability is described.

The design of integrated circuits generally consists of multiple subcircuits, referred to hereinafter as submodules, which are interconnected to form an overall module circuit. After fabrication, each module circuit is tested prior to shipment in a variety of ways to establish that it is operating properly.

The module may be tested as a single entity by placing known electrical signals on the module circuit input ports while observing output phenomena on the output ports. The disadvantage in testing the module device from external input and output ports results because the number of test cases required grows exponentially with the complexity of the module. Signal masking effects make it difficult to exercise all submodules, and the settling time varies greatly between submodules. This is especially significant for analog circuits.

Various techniques have been proposed to employ a "divide and conquer" strategy by partitioning the module into submodules in order that each submodule may be effectively isolated from the other submodules, and tested in its isolated condition to determine that each submodule works correctly.

Circuit techniques are employed on the individual module for gaining access to the internal ports of each submodule which has no direct connection to any external I/O pad of the module.

These techniques have been employed for digital and analog circuit modules, as well as for modules which are mixed analog digital circuits. One such technique, is described in an article entitled "Design for Testability for Mixed Analog/Digital ASICS" IEEE, 1988, Custom Integrated Circuits Conference, pages 16.5.1–16.5.4. This technique divides a mixed analog/digital ASIC chip into analog blocks and digital blocks, and uses multiplexers connected to internal ports between the blocks, permitting that internal port to be either controlled or observed from external I/O pads, depending on test mode control signals applied to the multiplexers.

In a paper entitled "Design for Testability of Mixed Signal Integrated Circuits" by Kenneth Wagner and T. W. Williams, 1988 International Test Conference, paper 39.1 pages 823–828, there is described a technique for providing macrotests on an integrated circuit. The circuit module is partitioned into a number of submodules, or macros, which define their own specific function.

In carrying out the partitioning of the circuit module, analog macro inputs are isolated and controlled so that macro outputs may be observed, via the use of analog multiplexers. The use of multiplexers requires an undesirable amount of module layout area overhead, as well as the necessity of running numerous additional wires from the multiplexer to various internal ports. There is also a limitation on the number of test configurations which may be conducted.

SUMMARY OF THE INVENTION

It is an object of the present invention to provide a system for partitioning a circuit module into individual testable submodules.

It is a more specific object of this invention to partition a circuit module using a minimum number of switching elements to preserve layout area.

It is yet another object of this invention to provide for a system for dynamically partitioning submodules within a circuit module in accordance with the sequence of data input to the device.

These and other objects of the invention are provided by extra circuitry added to the circuit module which will partition the module into individual submodules. In carrying out the invention, analog switches consisting of transmission gates are used to access the normal signal paths between submodules. The transmission gates are advantageously located near an internal input port of a submodule in the path of a signal line connecting the internal port to another internal output port of a second submodule. The transmission gates are additionally connected to a conductor of a test bus.

Each of the submodules having ports which are to be asserted or observed are connected through a transmission gate to the adjacent submodule. A logic circuit is provided for setting the switch state so that identified internal ports are either connected to a test bus conductor, which will supply an asserted condition to the input port, or the conductor is connected to the input port without disturbing the normal paths through the module, permitting observation of the signal conditions on the input port.

Extra input/output paths may be added to the module circuit substrate to accommodate shifting in data to the logic circuit, as well as provide direct access to one of the test bus conductors.

DESCRIPTION OF THE PREFERRED EMBODIMENT

Figure 1:
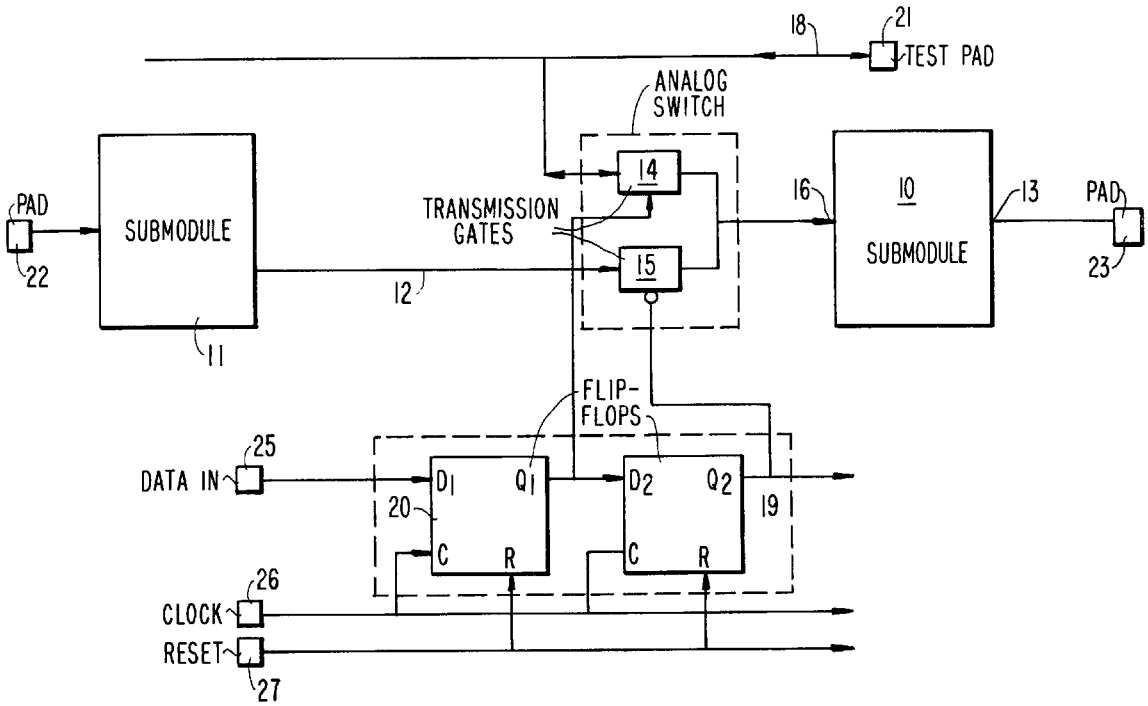
FIG. 1 illustrates the system for testing, implemented between two submodules 10 and 11, in accordance with a preferred embodiment. The analog switch is implemented using two transmission gates 14 and 15.

FIG. 1 illustrates in general terms how two submodules 10 and 11 may be partitioned from a circuit module in accordance with a test system of the preferred embodiment. The submodules 10 and 11 may be analog circuit blocks which exist on an integrated circuit as a single circuit. Partitioning the integrated circuit into submodules 10 and 11 permits the blocks to be tested in individual sections. The submodules 10 and 11 generally have an input port 16 and an output port 13. Usually such submodules would have more than one input, as well as more than one output.

The partitioning is accomplished with an analog switch 17 which is disposed adjacent an input port 16 of a module 10. The analog switch 17 is controlled from a pair of D flip-flops 19 and 20.

The analog switch 17 comprises two transmission gates 14 and 15. In CMOS fabrication processes, these transmission gates may be implemented by parallelly connected N-channel and P-channel transistors having gate connections connected through an inverter. These known transmission gates may be operated so that 14 is closed, and 15 is open, thus isolating output port 13 from input port 16, while connecting input port 16 to the bus conductor 18. A test signal can then be asserted to input port 16 via test pad 21.

By keeping both transmission gates 14 and 15 closed, a signal from output port 13 may be routed to a test bus conductor 18. In the normal operation state, the input port 16 and output port 13 are connected together. This is done by keeping 15 closed and 14 open.

Thus, it can be seen that the analog switch 17 permits both observability of input port 16 as well as the ability to assert a control signal on input port 16.

The configuration shown will permit verifying the integrity of the normal signal path 12. In so doing, the output signal from submodule 11 may be observed at test pad 21, or a desired input signal may be asserted on test pad 21, and the output port 13 of submodule 10 may be observed through a pad 23. Control over the analog switch 17 is provided by D flip-flops 19 and 20. The D flip-flops 19 and 20 provide on their Q outputs an enable signal to transmission gate 14 and transmission gate 15. Thus, by programming the flip-flops 19 and 20, it is possible to establish controllability over port 16 or observability over port 13.

The data for establishing a test condition is applied to a pad 28 on the integrated circuit. A clock pulse is supplied to a pad 26, clocking in serial data applied to the input pad 28. Thus, by clocking in two bits of input data, the transmission gates 14 and 15 may be set in accordance with the following Table.

TABLE I

| | Transmission Gates | | |
|---|---|---|---|
| Mode | 14 | 15 | Function |
| 1 | OFF | ON | Normal operation: output 13 of module 11 goes to input 16 of module 10 via 15 |
| 2 | ON | OFF | Control input of module 10: external test signal goes to input 16 via 14 |
| 3 | ON | ON | Observe output of module 11: output 13 goes to test pad via 15 and 14 |
| 4 | OFF | OFF | Isolution: both output 13 and input 16 are isolated |

It should be noted that mode 3 in Table 1 demonstrates that when the output 13 is observed, this output is observed with the usual loading presented at input terminal 16. The total load experienced by output 16 is the parallel combination of the normal load at port 16, and the extra load due to test pad 21 and external measuring instruments. However, for the most part, this mode permits accurate monitoring of the signal from output port 13 of submodule 11 under normal conditions.

Figure 2:
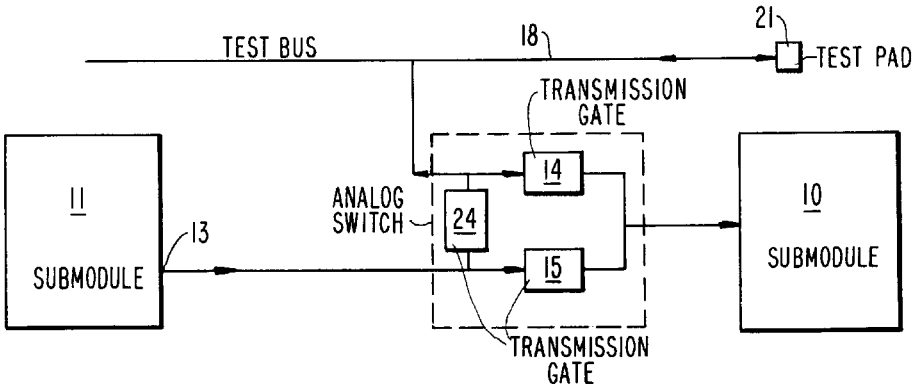
FIG. 2 illustrates a three-transmission gate implementation of the analog switch, having additional test capability over the embodiment of FIG. 1.

The foregoing embodiment using two transmission gates provides a reasonable compromise between conserving layout area on the integrated circuit surface and testability. It is possible to employ a third transmission gate 21 as shown in FIG. 2. The third transmission gate 24 will permit isolating the output node 13 during an observe function from the input port 16. The third transmission gate 24 can shunt the normal output signal directly to the test bus conductor 18, while transmission gates 14 and 15 are open, effectively isolating input port 16 from output port 13. However, it is considered that the foregoing two transmission gate embodiment is preferred to conserve on layout space for the integrated circuit substrate in the face of only marginal increases in testability when transmission gate 24 is employed.

Figure 3:
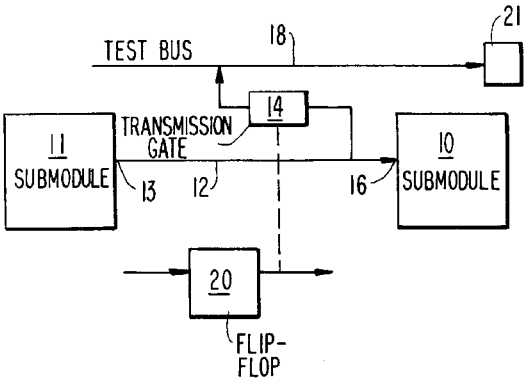
FIG. 3 shows an embodiment of the invention for providing an observability only function between two circuit submodules.
Figure 4:
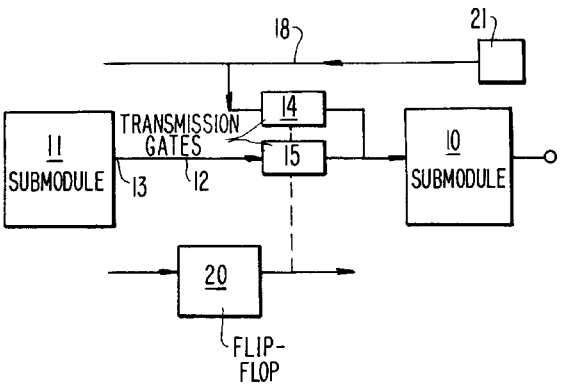
FIG. 4 illustrates an embodiment providing controllability only of an internal port of a submodule.

Other adaptations of the embodiment shown in FIG. 1 can be seen in FIGS. 3 and 4. In the case of FIG. 3, this simplified version of the testing scheme in accordance with the invention permit observing the condition on output port 13 under actual operating conditions. In the case of FIG. 4, the input port 16 may be asserted with a control signal from external test pad 18 while output port 13 is isolated.

It must be emphasized that the embodiments of FIGS. 1, 2 and 3 permit testing of the normal signal path 12 for each submodule. Therefore, once each individual submodule has been verified as testing successfully, the continuity of the interconnections between submodules is insured.

The sequence for testing the submodules 10 and 11 can be shown in Table II below, demonstrating the state of flip-flops 19 and 20 can be set by shifting in data sequentially to carry out the five functions noted. The two flip-flops 19 and 20 comprise a two-bit shift register which may be readily programmed through the data input 28 to implement the four described functions. A clock pulse 26, associated with shift registers, is applied to shift in each of the serial data bits.

TABLE II

| | Flip-Flops | | Transm. Gates | | |
|---|---|---|---|---|---|
| Action | 20 | 19 | 14 | 15 | Function |
| RESET | 0 | 0 | OFF | ON | Normal operation |
| Shift-in 1 | 1 | 0 | ON | ON | Observe output of module 11 |
| Shift-in 1 | 1 | 1 | ON | OFF | Control input of module 10 |
| Shift-in 0 | 0 | 1 | OFF | OFF | Isolation |
| Shift-in 0 | 0 | 0 | OFF | ON | Back to normal operation |

A reset pad 27 is shown connected to reset inputs of the flip-flops 19 and 20. The reset permits restoring a circuit to its normal functioning condition, wherein transmission gates 14 and 15 are rendered in the unswitched state, with transmission gate 15 being conductive and transmission gate 14 being non-conductive.

Figure 5:
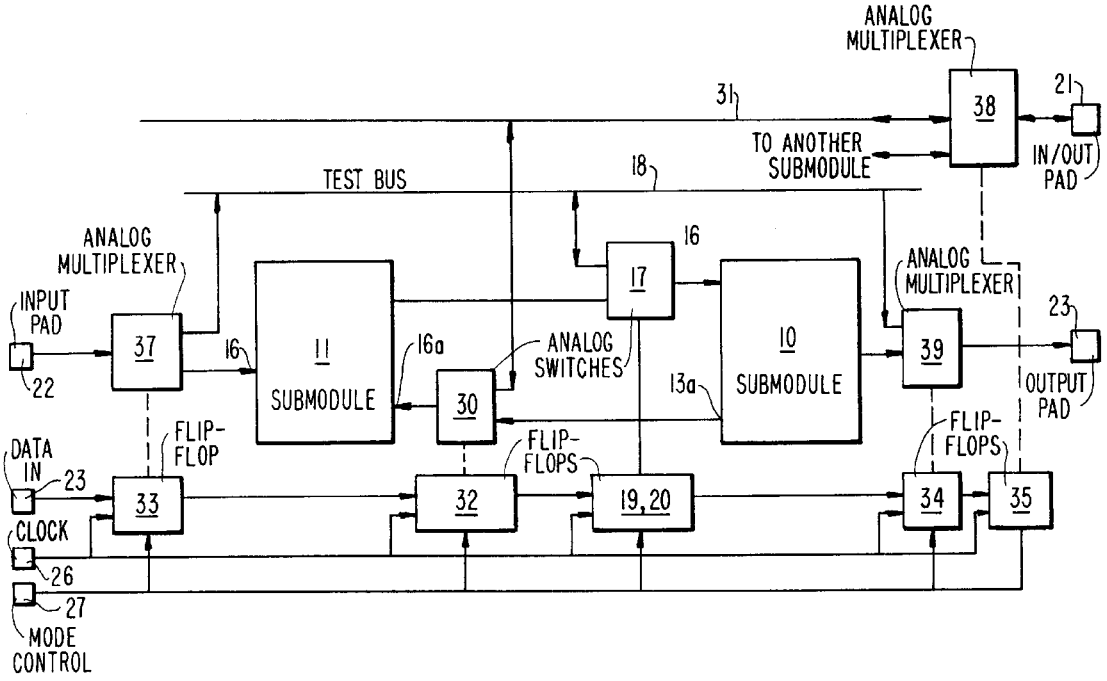
FIG. 5 illustrates a specific embodiment of the invention to partition a circuit module into two submodules.

The foregoing principles of partitioning circuits within an integrated circuit into submodules using three-way analog switches are shown implemented in FIG. 5 in a more realistic configuration of an integrated circuit.

FIG. 5 illustrates the probable connections from a subsequent submodule 10 to a preceding submodule 11. A second output port 13*a* is located in the succeeding submodule 10, and is connected through three-way analog switch 30 to the preceding submodule 11. Analog switch 30 has an input connected to the test bus conductor 31. The second bus conductor 31 may be employed to assert a signal condition on input 16*a,* or for routing the output 13*a* of submodule 10 to the bus conductor 31, depending on the state of analog switch 30. The switching states for the analog switch 30 is controlled by a pair of D flip-flops 32 serially connected with the aforesaid described D flip-flops 19 and 20 which control analog switch 17.

There is also shown analog multiplexers 37 and 39, which also consist of two transmission gates each. These analog multiplexers permit the reduction in the number of circuit pads needed for the integrated circuit. The analog multiplexer 37 permits the input pad 22, depending on the states of D flip-flop 33, to be connected either to the test bus 18 or an input 16 of submodule 11. Thus, the required input and output pads are kept to a minimum, consistent with good integrated circuit design. An in/out pad 21 is shown which may also be connected through an analog multiplexer 38. This permits the input/output pad 21 to access either test bus conductor 31, or a port of another submodule, which is not shown in this Figure. A D flip-flop 35 is used to control the switching state of analog multiplexer 38.

More than one test bus conductor can be accessed from a test pad by using larger multiplexers. For example, a 4 to 1 multiplexer can access either one of three bus conductors, or a port of some submodule. In this case, two flip-flops are necessary to control the switching state of the multiplexer.

By mapping more of the test functions to a single input/output pin, it is possible to hold the extra pad requirements to a minimum. However, it should be noted that only one internal output port at a time may be observed when using such multiplexing techniques. Thus, it may be necessary to assign more than one test mode for a given submodule.

Using the foregoing test scheme, area overhead on the substrate arises from analog switches, multiplexers, and any additional I/O pads located on the substrate. There is extra channel area required for routing the test bus and the control lines for the flip-flop. However, for many applications, these sources of area overhead are advantageous over other techniques for analog testing.

In applying the foregoing principles, it is clear that the number of conductors N in the test bus is proportional to the sum of the number of internal input ports which must be controlled simultaneously for a given submodule, and the number of internal output ports M which must be simultaneously observed for the testing of a submodule.

Figure 6:
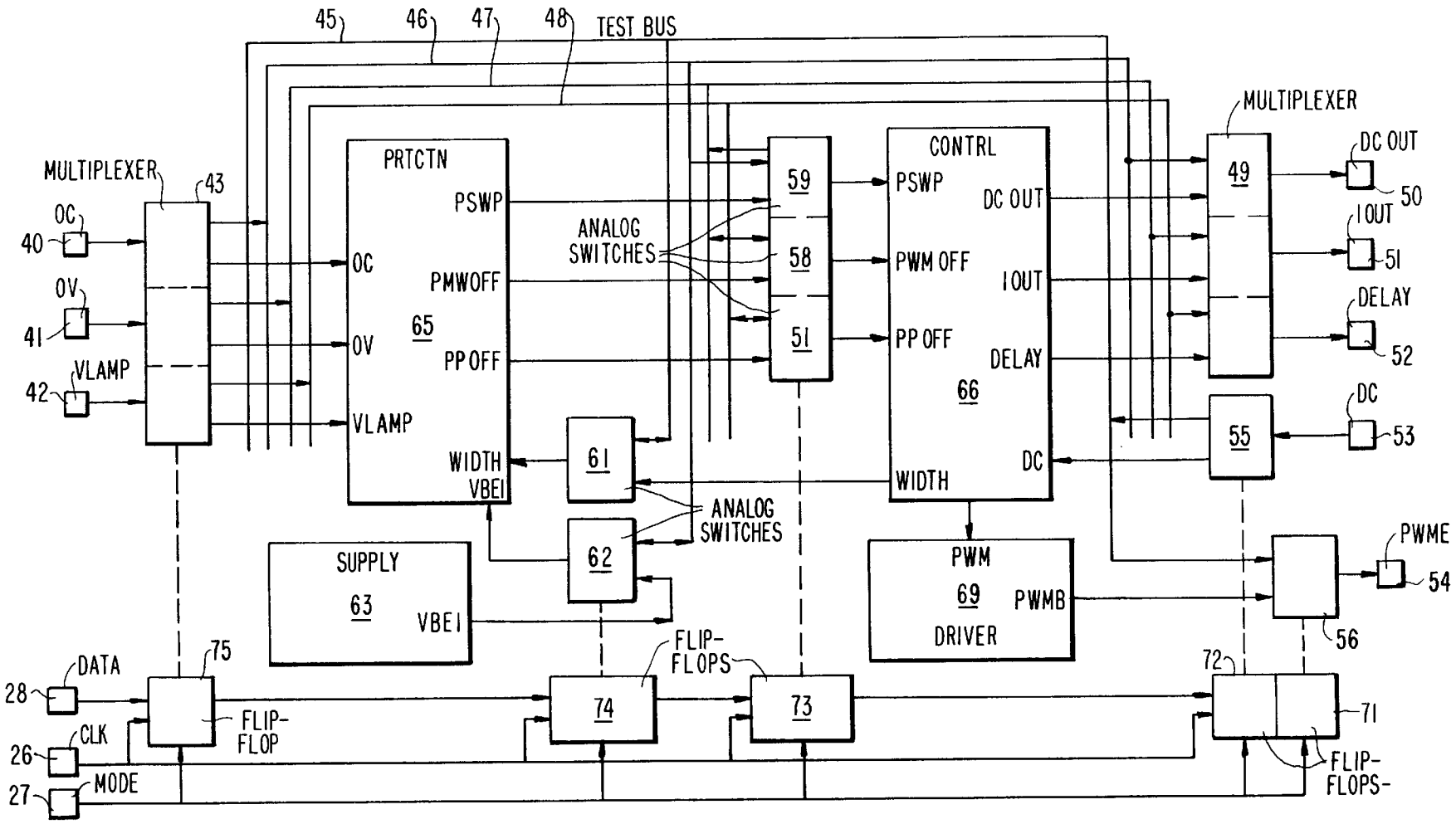
FIG. 6 illustrates a specific embodiment of the invention for implementing a test scheme on a fluorescent light ballast integrated circuit.

Finally, a specific implementation of the principles of the invention are shown in FIG. 6 for an integrated circuit serving as a ballast chip in a fluorescent lighting system. This common integrated circuit is exemplary only of how integrated circuits in general may be partitioned to permit submodule testing.

In this particular design, the ballast chip consists of four submodules. These include the driver module 69, control module 66, power supply module 63 and protection module 65. In establishing partitioning use is made of the fact that this integrated circuit already includes subdivisions into the four submodules. The three-way analog switches will be located to control selected internal ports of each of the four submodules. In establishing internal ports which will be controlled or observed, the following summary of Table III can be made:

TABLE III

| Module.Port | From | Type | Function |
|---|---|---|---|
| CONTRL.PWMOFF | PRTCN.PWMOFF | Logic | PWM on/off |
| CONTRL.PPOFF | PRTCTN.PPOFF | Logic | Push–Pull circuit on/off |
| CONTRL.FSWP | PRTCTN.FSWP | Analog | Sweeps oscillation freq. |
| PRTCTN.VBE1 | SUPPLY.VBE1 | Analog | Decreases w/ temperature |
| PRTCTN.WIDTH | CONTRL.WIDTH | Logic | Anti-capacitive load |

Given the number of internal ports to be controlled or observed, the total number of conductors in the test bus is found through the following Table:

TABLE IV

| Testing Module | Control Input | Observe Output | # Wire |
|---|---|---|---|
| CONTRL | {PWMOFF, PPOFF, FSWP} | {WIDTH} | 4 |
| PRTCTN | {VBE1, WIDTH} | {PWMOFF, PPOFF, FSWP} | 5 |
| | Alternatively, we can observe outputs one at a time: | | |
| | {VBE1, WIDTH} | {PWMOFF} | 3 |
| | {VBE1, WIDTH} | {PPOFF} | |
| | {VBE1, WIDTH} | {FSWP} | |
| SUPPLY | | {VBE1} | 1 |

This Table will establish for each module which inputs are to be asserted simultaneously and which output ports are to be observed. The number of required bus conductors for each of the tests of Table IV can be reduced if ports are observed sequentially. Thus, when testing protection module PRTCN, by observing only one of PWMOFF, PPOFF, FSWP at a time, the number of conductors may be reduced to three, two for asserting control signals on VBE1, WIDTH and one for observing at different times PWMOFF, PPOFF and FSWP. This increases testing time for submodule PRTCTN since ports are being sequentially observed.

The number of conductors adds chip area overhead to the module. This consideration must be balanced with the need for conserving testing time. Table V illustrates one solution which is considered a good compromise between the number of bus conductors and testing time.

As Table V indicates, wires 46, 47 and 48 are connected to control FSWP, PWMOFF, PPOFF, while wire 45 observes the width during mode number 1. The remaining entries of the Table show three additional test modes, wherein the four wires of the bus are used to implement the indicated "C" control signals on the control ports, while simultaneously observing the indicated "O" signals on the observe ports.

Having now decided which conductors of the bus are to be routed to a given port during a test, using the analog switches of FIG. 6, it is possible to map each of the ports set forth in Table V to either an output multiplexer 49 for observing signals, or an input multiplexer 43 for asserting the control signals for each of the tests set forth in Table V.

TABLE V

| Mode Testing | Wire #45 | Wire #46 | Wire #47 | Wire #48 |
|---|---|---|---|---|
| 1 CONTRL | WIDTH (o) | FSWP (c) | PWMOFF (c) | PPOFF (c) |

TABLE V-continued

| Mode | Testing | Wire #45 | Wire #46 | Wire #47 | Wire #48 |
|---|---|---|---|---|---|
| 2 | PRTCTN | WIDTH (c) | VBE1 (c) | PWMOFF (o) | PPOFF (o) |
| 3 | PRTCTN | WIDTH (c) | VBE1 (c) | FSWP (o) | |
| 4 | SUPPLY | | VBE1 (o) | | |

A multiplexer 43 is shown which multiplexes normal input signals OC (corresponding to an over-current sensed condition), OV (corresponding to an over-voltage condition), and VLAMP (corresponding to the voltage across the fluorescent lamp). These pins may additionally be used during tests of the integrated circuit to apply any three required control signals to any three test bus conductors 45, 46 and 47.

The test bus conductors 45, 46, 47 and 48 are connected to respective analog switches 61 and 62, 57, 58 and 59 for either observing or asserting a control condition on an internal port of the submodules. As can be seen, analog switches 57, 58 and 59 can assert the required control signal input from circuit pads 40, 41 and 42 on each of the inputs FSWP, PWMOFF, PPOFF of the control submodule 66.

This assert condition is established by the states of flip-flops 75 and 73, such as to make sure the switches assume a state for asserting these conditions.

The multiplexer 49 will permit observing an internal port condition on any of test buses 46, 47 and 48. The multiplexer 49 will, under control of flip-flop 72, connect circuit pad 50 with bus conductor 46, circuit pad 51 with bus conductor 47, and circuit pad 52 with bus conductor pad 48. An analog multiplexer 55 will permit circuit pad 53 to be connected to conductor 45. A circuit pad 54 will permit observation of bus 45 under control of flip-flop 71.

As will be obvious, the circuit pads 40, 41 and 42 and 50, 51, 52, 53 and 54 are normal signal input and output connections for the integrated circuit of FIG. 6. The use of the multiplexers 43, 49, 55 and 56 will therefore maintain the circuit pinout at a minimum.

Additional analog switches 61 and 62 are connected to isolate the PRTCTN 65 from the CONTRL 66 submodule and from the supply 63 submodule. These gates are enabled by D flip-flop sequence 74. It will be obvious that flip-flop sequence 74 provides a four-bit output and flip-flop sequence 73 provides a three-bit output for controlling the respective analog switches. As will be evident from Table V, by appropriately setting each of the flip-flop sequences 73 and 74, the internal ports WIDTH and VBE1 can either be controlled or observed via the test bus conductors 45 and 46.

As was described with the earlier Figures, three additional pads are employed for clocking in test pattern data to the flip-flops 71 through 75. This includes data input pad 28, a clock pad 26 and a mode pad 27 for resetting the flip-flops. In the reset condition, the integrated circuit is set for its normal operation.

Thus, there is described with respect to several examples, implementation of a test scheme for integrated circuits. The test scheme is useful for testing to provide isolation of deflects within the integrated circuit. This is useful in that integrated circuits may tend to have the same submodule defective. By early location of a particular defective submodule, corrections to the manufacturing process may be implemented at an early stage. Additionally, potential savings in testing time are recognized. This occurs as in analog circuits in particular, a settling time is necessary for each part of the entire circuit. By partitioning the circuit, variable time steps for testing of different portions may be utilized, rather than waiting a test time equal to that for the module having the longest required settling time.

The system permits different tests to be executed during different portions of the manufacturing process. For instance, it is common to do a wafer probe test, followed by a package test in integrated circuit manufacture. It is possible to set up distinctly different tests using the foregoing programmable feature of the D flip-flops.

Thus there is described an invention, including to several examples, which will be more particularly disclosed, but not limited by, the claims which follow.

What is claimed is:

1. A circuit for testing analog submodules, the submodules being arranged, in an inter-connected network including a succeeding submodule which receives an input from a preceding submodule, on an integrated circuit, the *testing* circuit comprising:

(a) a test bus comprising a plurality of conductors disposed on said integrated circuit, one of said conductors terminating in an input/output connection;

(b) at least one 3-way analog switch, each switch comprising:

(i) first and second transmission gates connected together at one end, (ii) an output connection connected to the one end and *for connecting* to an input of the succeeding submodule, (iii) an input/output connection connected to said one conductor and to another end of the first transmission gate, and (iv) an input connection [connected] *for connecting* to an output of the preceding submodule and *connected* to another end of the second transmission gate; and (c) a plurality of flip-flops, each coupled with a control input of at least one of said transmission gates, said flip-flops being arranged in series to receive on a data-in conductor a bit data pattern for configuring selected analog switches to connect an output signal of said preceding submodule to said conductor or to provide an input signal to said succeeding submodule, said flip-flops being arranged so that the first and second transmission gates within a single switch are associated with separate ones of the flip-flops.

2. The circuit of claim 1 wherein said flip-flops are D-type flip-flops, each further including a respective clock input, all of the respective clock inputs being connected together.

3. The circuit of claim 1, further comprising (a) at least one second 3-way analog switch having:

(i) first and second transmission gates connected together at one end, (ii) an output connection connected to the one end and *for connecting* to an input of the preceding submodule, (iii) an input/output connection connected to said one conductor and to another end of the first transmission gate, and (iv) an input connection [connected] *for connecting* to an output of the succeeding submodule and *connected* to another end of the second transmission gate; and (b) wherein:

(i) the flip-flops comprise:

(A) a first pair including first first and second flip-flops; and (B) a second pair including second first and second flip-flops;

(ii) the first transmission gate in the at least one 3-way analog switch being coupled to the first first flip-flop;

(iii) the second transmission gate in the at least one 3-way analog switch being coupled to the first second flip-flop;

(iv) the first transmission gate in the at least one second 3-way analog switch being coupled to the second first flip-flop; and (v) the second transmission gate in the at least one second 3-way analog switching being coupled to the second second flip-flop.

4. The circuit of claim 3, wherein the at least one 3-way analog switch comprises a plurality of 3-way analog switches, each having a respective first transmission gate coupled to the first first flip-flop and a respective second transmission gate coupled to the first second flip-flop.

5. The circuit of claim 3, wherein the at least one second 3-way switch comprises a plurality of 3-way analog switches, each having a respective first transmission gate coupled to the second first flip-flop and a respective second transmission gate coupled to the second second flip-flop.

6. The circuit of claim 5, wherein *the submodules are disposed on a common substrate along with the testing circuit; and*

(a) the at least one 3-way analog switch comprises a plurality of 3-way analog switches, each having (i) a respective first transmission gate coupled to the first first flip-flop; and (ii) a respective second transmission gate coupled to the first second flip-flop; and

[(b) the submodules are disposed on a common substrate; and]

([c] *b*) the *testing* circuit further comprises:

(i) an input analog multiplexer having (A) an input connected to a signal input connection of said common substrate, (B) a first output to one of said test bus conductors, *and*

(C) [and] a second output [connected] *for connecting* to an input of said preceding submodule, the input analog multiplexer *being for* selectively permitting a signal to be supplied from said signal input to said preceding submodule and said one test bus conductor;

(ii) an output analog multiplexer having:

(A) a first input [connected] *for connecting* to an output of said succeeding submodule, (B) a second input connected to said one test bus conductor, and (C) an output connected to a signal output connection of said common substrate.

7. The circuit of claim 1 wherein the at least one 3-way analog switch further comprises a third transmission gate coupled between the input connection of the at least one 3-way analog switch and the input/output connection of the at least one 3-way analog switch.

8. The circuit of claim 1 further comprising a data input connection [connected to supply] *for supplying* data to said flip-flops, and wherein the first and second flip-flops are serially connected, and *the flip-flops are further for receiving* a test data configuration [is] shifted into [said] *the* flip-flops through said data input connection.

9. The circuit of claim 1 further comprising a reset connection [connected to rest] *for resetting* said flip-flops[, said reset] *and thus* establishing input/output connections of said modules to a normal, *non-test* configuration.

10. A circuit for testing analog submodules, the submodules being arranged in an interconnected network including a succeeding submodule which receives an input from a preceding submodule on an integrated circuit, the *testing* circuit comprising:

(a) a test bus comprising a plurality of conductors disposed on said integrated circuit, one of said conductors terminating in an input/output connection;

(b) at least one three-way analog switch, each switch comprising:

(i) an output connection [connected] *for connecting* to an input of the succeeding submodule, (ii) an input/output connection connected to said one conductor, and (iii) an input connection [connected] *for connecting* to an output of the preceding submodule; and (c) means for configuring the at least one 3-way analog switch to assume one of the following states:

(i) a first state [in which] *for connecting* the input of the succeeding module [is connected] to the output of the preceding module, and not the one conductor;

(ii) a second state [in which] *for connecting* the input of the succeeding module to the one conductor and not the preceding module; and (iii) a third state [in which] *for connecting* the output of the preceding module [is connected] to both the input of the succeeding module and the one conductor.

11. The circuit of claim 10, *19, or 20* wherein each of the at least one 3-way analog switch further comprises first and second transmission gates connected together at one end.

12. The circuit of claim 11 wherein the means for configuring the at least one 3-way analog switch comprises a plurality of flip-flops, each associated with at least one of said transmission gates, said flip-flops being arranged in series to receive on a data-in conductor a bit data pattern, the first and second transmission gates in each switch being associated with separate ones of the flip-flops.

13. The circuit of claim 12 wherein said flip-flops are D-type flip-flops, each further including a respective clock input, all of the respective clock inputs being connected together.

14. The circuit of claim 12, wherein the at least one 3-way analog switch comprises a plurality of 3-way analog switches, the input connection of the first transmission gate in each switch being coupled with a first one of the flip-flops, the input connection of the second transmission gate in each switch being coupled with a second one of the flip-flops.

15. The circuit of claim 10, *19, or 20,* further comprising (a) at least one second 3-way analog switch comprising (i) an input connection [connected] *for connecting* to an output of the succeeding submodule;

(ii) an input/output *connection* connected to said one conductor[,]; and (iii) an output [connected] *connection for connecting* to an input of the preceding submodule; and (b) means for configuring the at least one second 3-way switch to assume one of the following states (i) a first state [in which] *for connecting* the input of the preceding module [is connected] to the output of the succeeding module, and not the other conductor;

(ii) a second state [in which] *for connecting* the input of the preceding module [is connected] to the one conductor and not the succeeding module; and (iii) a third state [in which] *for connecting* the output of the succeeding module [is connected] to both the input of the preceding module and the one conductor.

16. The circuit of claim 15, wherein the at least one 3-way analog switch comprises a plurality of 3-way analog switches in parallel.

17. The circuit of claim 15, wherein the at least one second 3-way analog switch comprises a plurality of 3-way analog switches in parallel.

18. The circuit of claim 11 wherein the at least one 3-way analog switch further comprises a third transmission gate coupled between the input connection of the at least one 3-way analog switch and the input/output connection of the at least one 3-way analog switch.

*19. A test circuit for testing a subject circuit that includes at least one subject circuit input and an analog module, the test circuit using a test bus, the at least one subject circuit input being only for receiving signals and not for supplying signals, the test bus being for carrying test signals during a test mode of the subject circuit, the test bus being unused during a non-test operating mode of the subject circuit, the testing circuit comprising:*

*a) at least one analog switch, each switch having at least three states and comprising at least the following connections*

*i) an output connection for connecting and outputting signals to the at least one subject circuit input;*

*ii) an input/output connection for connecting to and inputting and outputting the test signals to and from at least one wire of the test bus;*

*iii) an input connection for receiving an input signal for the subject circuit; and*

*b) means for configuring the at least one analog switch to assume any one of a set of states, which set includes the following states:*

*i) a first state for connecting the input connection to the output connection, for enabling the input signal to reach the at least one subject circuit input;*

*ii) a second state for connecting the input/output connection to the output connection, for enabling at least one test signal to reach the at least one subject circuit input; and*

*iii) a third state for connecting the input connection to the input/output connection, for enabling the input signal to reach the test bus.*

*20. A test circuit for testing a subject circuit that includes at least one subject circuit output and an analog module, the test circuit using a test bus, the at least one subject circuit output being only for supplying signals and not for receiving signals, the test bus being for carrying test signals during a test mode of the subject circuit, the test bus being unused during a non-test operating mode of the subject circuit, the testing circuit comprising:*

*a) at least one analog switch, each switch having at least three states and comprising at least the following connections*

*i) an output connection for supplying an output signal from the subject circuit;*

*ii) an input/output connection for connecting to inputting and outputting the test signals to and from at least one wire of the test bus;*

*iii) an input connection for connecting to and receiving signals from the at least one subject circuit output;*

*b) means for configuring the at least one switch to assume any one of a set of states, which set includes the following states:*

*i) a first state in which the input connection is connected to the output connection for enabling the output signal to be supplied from the subject circuit;*

*ii) a second state in which the input/output connection is connected to the output connection for enabling the test signals to reach the output connection;*

*iii) a third state in which the input connection is connected to the input/output connection, for enabling the output signal from the subject circuit to reach the test bus.*

*21. The circuit of claim 19 or 20 wherein*

*the switch comprises a first and at least one second sub-switches, the first switch being for coupling and decoupling the input connection and the output connection, whereby when the input and the output are coupled, the first state is achieved, and the at least one second sub-switch being for coupling and decoupling to the at least one wire of the test bus, whereby the second or third state is achieved.*

*22. The circuit of claim 21 wherein the first and second sub-switches are coupled so that the third state uses both the first and second sub-switches.*

*23. The circuit of claim 19 or 20 wherein the input/output connection comprises at least two bidirectional lines each coupled to a respective one of at least two wires of a test bus.*

*24. The circuit of claim 19 or 20 wherein the analog module is part of an integrated circuit.*

*25. A testable system comprising*

*the test circuit of claim 19;*

*the test bus; and*

*the subject circuit.*

*26. A testable system comprising*

*the test circuit of claim 20;*

*the test bus; and*

*the subject circuit.*

*27. The test circuit of claim 19 wherein the configuring means comprises means for transmitting a signal to the at least one analog switch for controlling the state of the at least one analog switch.*

*28. The test circuit of claim 20 wherein the configuring means comprises means for transmitting a signal to the at least one analog switch for controlling the state of the at least one analog switch.*

*29. A testable system comprising*

*the circuit of claim 1; and*

*the succeeding submodule.*

*30. A testable system comprising*

*the circuit of claim 3;*

*the succeeding submodule; and*

*the preceding submodule.*

*31. A testable system comprising*

*the circuit of claim 6;*

*the common substrate;*

*a plurality of submodules for connecting to inputs or outputs of the at least one 3-way switch.*

*32. A testable system comprising*

*the circuit of claim 10;*

*the preceding submodule;*

*the succeeding submodule.*

*33. A testable system comprising*

*the circuit of claim 15;*

*the preceding submodule; and*

*the succeeding submodule.*

*34. The circuit of claim 10 wherein the means for configuring comprises means for transmitting a signal to the at least one three-way switch for controlling the state of the at least one three-way switch.*

* * * * *

UNITED STATES PATENT AND TRADEMARK OFFICE

CERTIFICATE OF CORRECTION

PATENT NO. : RE 37,500 E
APPLICATION NO. : 08/752827
DATED : January 8, 2002
INVENTOR(S) : Nai - Chi Lee It is certified that error appears in the above-identified patent and that said Letters Patent is hereby corrected as shown below:

Column 8, line 35, delete " [connected] ".

Column 8, line 60, delete " [connected] ".

Column 9, line 32, delete " [ (b) the submodules are disposed on a common substrate;".

Column 9, line 33, delete "and] ".

Column 9, line 34, delete " [c] ".

Column 9, line 40, delete "and" and " [connected] ".

Column 9, line 43, delete "from said signal".

Column 9, line 44, delete "input".

Column 9, line 47, delete " [connected] ".

Column 9, line 59, delete " [connected to supply] ".

Column 9, line 62, delete " [is] " and " [said] ".

Column 9, line 65, delete " [connected to rest] " " [ ".

Column 9, line 66, delete "said reset] ".

Column 10, line 12, delete " [connected] ".

Column 10, line 16, delete " [connected] ".

Column 10, line 20, delete " [in which] ".

Column 10, line 21, delete " [is connected] ".

Column 10, line 23, delete " [in which] ".

Column 10, line 26, delete " [in which] ".

Column 10, line 27, delete " [is connected] ".

UNITED STATES PATENT AND TRADEMARK OFFICE

CERTIFICATE OF CORRECTION

PATENT NO. : RE 37,500 E
APPLICATION NO. : 08/752827
DATED : January 8, 2002
INVENTOR(S) : Nai - Chi Lee It is certified that error appears in the above-identified patent and that said Letters Patent is hereby corrected as shown below:

Column 10, line 51, delete " [connected] ".

Column 10, line 54, delete " [ , ] ".

Column 10, line 55, delete " [connected] ".

Column 10, line 59, delete " [in which] ".

Column 10, line 60, delete " [is connected] ".

Column 10, line 62, delete " [in which] ".

Column 10, line 63, delete " [is connected] ".

Column 10, line 65, delete " [in which] ".

Column 10, line 66, delete " [is connected] ".

Signed and Sealed this

Thirty-first Day of October, 2006

JON W. DUDAS
*Director of the United States Patent and Trademark Office*